(12) United States Patent
Moebius et al.

(10) Patent No.: US 10,416,468 B2
(45) Date of Patent: Sep. 17, 2019

(54) LIGHT FIELD GENERATOR DEVICES WITH SERIES OUTPUT COUPLERS

(71) Applicant: The Charles Stark Draper Laboratory, Inc., Cambridge, MA (US)

(72) Inventors: Michael G. Moebius, Somerville, MA (US); Gregg E. Favalora, Bedford, MA (US); Joseph J. Register, Cambridge, MA (US); Steven J. Byrnes, Watertown, MA (US); Ian W. Frank, Arlington, MA (US); Dennis M. Callahan, Wellesley, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 14 days.

(21) Appl. No.: 15/938,700

(22) Filed: Mar. 28, 2018

(65) Prior Publication Data
US 2018/0284466 A1 Oct. 4, 2018

Related U.S. Application Data

(60) Provisional application No. 62/478,804, filed on Mar. 30, 2017, provisional application No. 62/477,511, filed on Mar. 28, 2017.

(51) Int. Cl.
*G02B 27/22* (2018.01)
*G02B 6/34* (2006.01)
(Continued)

(52) U.S. Cl.
CPC ............ *G02B 27/225* (2013.01); *G02B 5/32* (2013.01); *G02B 6/34* (2013.01); *G02F 1/0353* (2013.01);
(Continued)

(58) Field of Classification Search
CPC .. G02B 27/225; G02F 1/335; G02F 2201/305
See application file for complete search history.

(56) References Cited

U.S. PATENT DOCUMENTS

| 7,847,869 B2 | 12/2010 | Nelson et al. |
| 2014/0300694 A1 | 10/2014 | Smalley et al. |

(Continued)

FOREIGN PATENT DOCUMENTS

| WO | WO 2007062098 | 5/2007 |
| WO | WO 2013163347 | 10/2013 |
| WO | WO 2013180737 | 12/2013 |

OTHER PUBLICATIONS

Byrnes, S.J., et al. "Designing large, high-efficiency, high-numerical-aperture, transmissive meta-lenses for visible light," Opt. Exp., 24 (5): 5110-5124 (2016).
(Continued)

*Primary Examiner* — John Bedtelyon
(74) *Attorney, Agent, or Firm* — HoustonHogle LLP

(57) ABSTRACT

Electro-holographic light field generator devices comprising surface acoustic wave (SAW) optical modulators are disclosed that employ multiple output couplers. These output couplers might be distributed along waveguides of the SAW modulators, within output coupling regions. Each of these output couplers can be configured for directing an incident leaky mode light at different output angles. In some cases, it may be desirable to employ the output couplers to function as different sub-pixels, to provide light to different viewing directions. The output couplers may be mirrors, volume gratings, chirped gratings, reflection gratings, two dimensional gratings, and/or transmission gratings. The output couplers may be angled so that the coupling output fans for each optical modulator are offset from the waveguide for that optical modulator.

29 Claims, 15 Drawing Sheets

(51) Int. Cl.
| | |
|---|---|
| G02B 5/32 | (2006.01) |
| G02B 6/12 | (2006.01) |
| G02F 1/335 | (2006.01) |
| G02F 1/035 | (2006.01) |
| G02F 1/125 | (2006.01) |
| G03H 1/02 | (2006.01) |
| G03H 1/22 | (2006.01) |
| G03H 1/26 | (2006.01) |
| H04N 13/302 | (2018.01) |
| H03H 9/02 | (2006.01) |

(52) U.S. Cl.
CPC .............. *G02F 1/335* (2013.01); *G03H 1/02* (2013.01); *G03H 1/2294* (2013.01); *H04N 13/302* (2018.05); *G02B 2006/12104* (2013.01); *G02B 2006/12107* (2013.01); *G02B 2006/12142* (2013.01); *G02F 1/125* (2013.01); *G02F 2201/305* (2013.01); *G02F 2203/07* (2013.01); *G02F 2203/24* (2013.01); *G02F 2203/28* (2013.01); *G02F 2203/58* (2013.01); *G03H 1/265* (2013.01); *G03H 2001/0224* (2013.01); *G03H 2001/2242* (2013.01); *G03H 2001/2292* (2013.01); *G03H 2223/16* (2013.01); *G03H 2223/17* (2013.01); *G03H 2225/12* (2013.01); *G03H 2225/21* (2013.01); *G03H 2225/23* (2013.01); *G03H 2225/33* (2013.01); *G03H 2225/55* (2013.01); *H03H 9/02968* (2013.01)

(56) References Cited

U.S. PATENT DOCUMENTS

| | | | |
|---|---|---|---|
| 2014/0300695 | A1 | 10/2014 | Smalley et al. |
| 2014/0376207 | A1 | 12/2014 | Futterer |
| 2016/0223988 | A1 | 8/2016 | Bove, Jr. et al. |
| 2018/0074457 | A1* | 3/2018 | Jolly .................... G02B 6/0016 |

OTHER PUBLICATIONS

Datta, B.C., et al. "Direct-laser metal writing of surface acoustic wave transducers for integrated-optic spatial light modulators in lithium niobate," Proc. SPIE Adv. Fab. Tech. for Micro/Nano Optics and Photonics X, 10115 (2017).

Geng, J., "Three-dimensional display technologies," Advances in Optics and Photonics, 5: 456-535 (2013).

Hamidon, M. N., et al. "Sensing Materials for Surface Acoustic Wave Chemical Sensors," Progresses in Chemical Sensor; Edited by Wen Wang: 161-179 (2016).

Hinkov, V.P., et al. "Collinear Acoustooptical TM-TE Mode Conversion in Proton Exchanged Ti:LiNbO3 Waveguide Structures," J. Lightwave Tech., 6(6): 903-908 (1988).

Jolly, S., et al. "Computation of Fresnel holograms and diffraction-specific coherent panorama grams for full-color holographic displays based on leaky-mode modulators," Proc. SPIE Practical Holography XXIX, 9386, 93860A (Mar. 10, 2016).

Jolly, S., et al. "Near-to-eye electroholography via guided-wave acousto-optics for augmented reality," Proc. of SPIE vol. vol. 10127. 2017, (p. 101270J).

Kulick, J.H., et al., "Partial pixels: a three-dimensional diffractive display architecture," JOSA A, 12(1), 73-83 (1995).

Lucente, M., "Computational holographic bandwidth compression," IBM Systems Journal, 35(3 & 4): 349-365 (1996).

Matteo, A.M., et al., "Collinear Guided Wave to Leaky Wave Acoustooptic Interactions in Proton-Exchanged LiNbO3 Waveguides, IEEE Trans. on Ultrasonics, Ferroelectrics, and Frequency Control," 47(1): 16-28 (2000).

McLaughlin, S., et al., "Optimized guided-to-leaky-mode device for graphics processing unit controlled frequency division of color," Appl. Opt., 54(12): 3732-3736 (2015).

Onural, L., et al. "New high-resolution display device for holographic three-dimensional video: principles and simulations," Optical Engineering, 33(3):835-844 (1994).

Pan, Y., et al. "A Review of Dynamic Holographic Three-Dimensional Display: Algorithms, Devices, and Systems, IEEE Transactions on Industrial Informatics," 12(4), 1599-1610 (2016).

Qaderi, K., et al. "Leaky-mode waveguide modulators with high deflection angle for use in holographic video displays," Opt. Expr., 24(18): 20831-20841 (2016).

Smalley, D.E., et al. "Anisotropic leaky-mode modulator for holographic video displays," Nature, 498, 313-317 (2013).

Savidis, N., et al. "Progress in fabrication of waveguide spatial light modulators via femtosecond laser micromachining," Proc. of SPIE vol. vol. 10115 (2017).

Smithwick, Q.Y., et al. "Interactive holographic stereograms with accommodation cues, Practical Holography XXIV: Materials and Applications," ed. Hans I. Bjelkhagen and Raymond K. Kostuk, SPIE (2010).

Taillaert, D., et al., "An out-of-plane grating coupler for efficient butt-coupling between compact planar waveguides and single-mode fibers," IEEE Journal of Quantum Electronics, 38(7), 949-955 (2002).

Tsai, C.S., et al. "Guided-Wave Two-Dimensional Acousto-Optic Scanner Using Proton-Exchanged Lithium Niobate Waveguide," Fiber and Integrated Optics, 17: 157-166 (1998).

Truxal, S.C., et al. "Design of a MEMS tunable polymer grating for single detector spectroscopy," International Journal of Optomechatronics, 2.2: 75-87 (2008).

Zhou, G., et al. "Genetic local search algorithm for optimization design of diffractive optical elements," Appl. Opt., 38(20): 4281-4290 (1999).

Mizeikis, V., et al., "Direct Laser Writing: Versatile Tool for Microfabrication of Lithium Niobate," Journal of Laser Micro/Nanoengineering, 7(3), 345-350 (2012).

Van Erps, J., et al. "Discrete out-of-plane coupling components for printed circuit board-level optical interconnections," IEEE Photonics Technology Letters, 19 (21): 1753-1755 (2007).

Aschwanden, M., et al. "Diffractive transmission grating tuned by dielectric elastomer actuator," IEEE Photonics Technology Letters, 19(14), 1090-1092 (2007).

Benes, E., et al. "Comparison between BAW and SAW sensor principles," IEEE Trans. on Ultrasonics, Ferroelectrics, and Frequency Control, 45(5): 1314-1330 (1998).

International Search Report and Written Opinion of the International Searching Authority, dated Jul. 5, 2018, from International Application No. PCT/US2018/024860, filed on Mar. 28, 2018. 16 pages.

Jolly, S., et al., "Progress in transparent flat-panel holographic displays enabled by guided-wave acousto-optics," Proc. SPIE 10558, Practical Holography XXXII: Displays, Materials, and Applications,105580L-1-105580L-7 (2018).

* cited by examiner

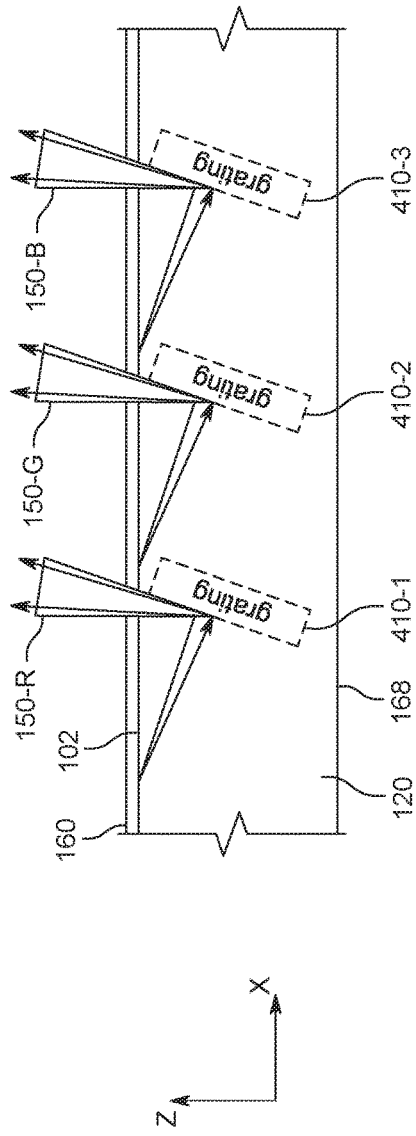
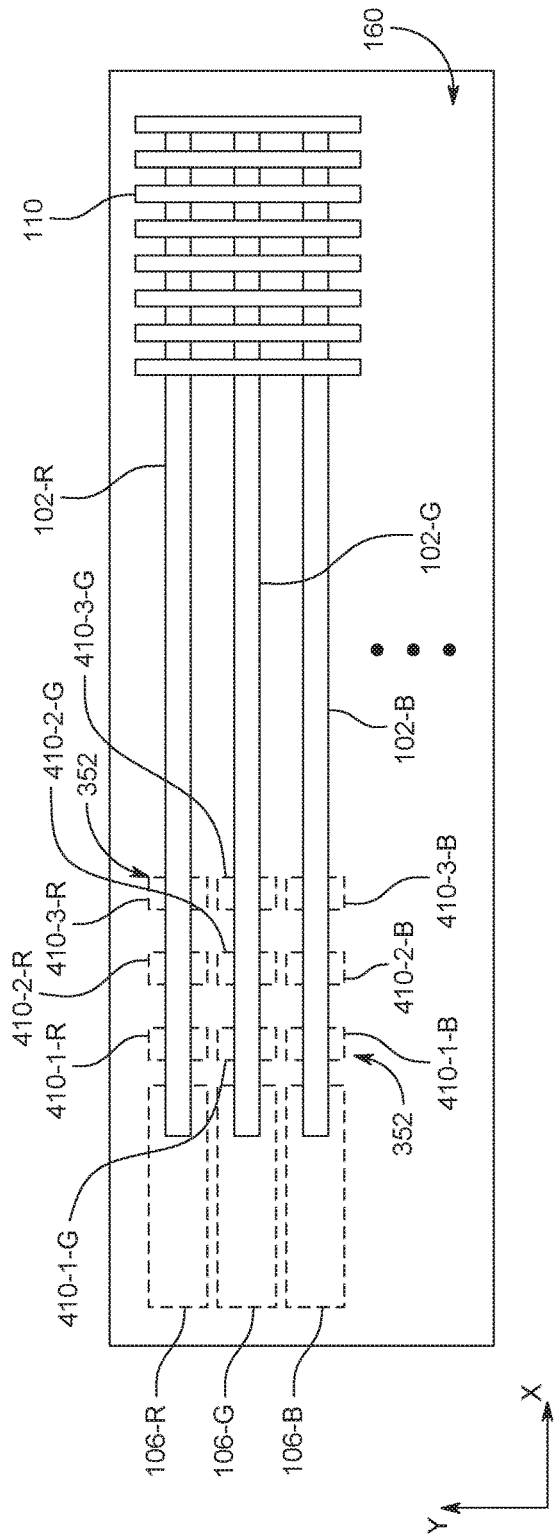

LIGHT FIELD GENERATOR DEVICES WITH SERIES OUTPUT COUPLERS

RELATED APPLICATIONS

This application claims the benefit under 35 USC 119(e) of U.S. Provisional Application No. 62/477,511, filed on Mar. 28, 2017, which is incorporated herein by reference in its entirety.

This application also claims the benefit under 35 USC 119(e) of U.S. Provisional Application No. 62/478,804, filed on Mar. 30, 2017, which is incorporated herein by reference in its entirety.

BACKGROUND OF THE INVENTION

A number of proposed autostereoscopic (naked-eye) 3D displays and, more broadly, light field generator architectures utilize a variety of scanning, diffraction, space-multiplexing, steered illumination, and other techniques. One category, electro-holographic displays, relies principally on diffractive phenomena to shape and steer light. Examples of electro-holographic displays are described in: Jason Geng, *Three-dimensional display technologies*, Advances in Optics and Photonics, 5, 456-535 (2013) and Yijie Pan et al., *A Review of Dynamic Holographic Three-Dimensional Display: Algorithms, Devices, and Systems*, IEEE Transactions on Industrial Informatics, 12(4), 1599-1610 (August 2016). Electro-holographic light field generators hold the promise of projecting imagery with the ultimate in realism: curved optical wavefronts, which can genuinely replicate the real world. Such displays can theoretically provide nearly perfect characteristics of visual depth information, color rendering, optical resolution, and smooth transitions as the viewer changes their location. So far, displays built on this technology have not achieved this theoretical level of performance.

One specific device category that provides controllable sub-holograms from which a light field can be constructed uses what is known as a surface acoustic wave (SAW) modulator. A SAW is generated in a piezoelectric substrate under radio frequency (RF) excitation. This creates a time-varying diffracting region that interacts with input light in the waveguide. This causes at least some of the light to change from a guided mode within the waveguide to a leaky mode that exits the waveguide. This is described more fully, for example, in:

Onural et al., "New high-resolution display device for holographic three-dimensional video: principles and simulations," Optical Engineering, vol. 33(3), pp. 835-44 (1994);

Matteo et al., *Collinear Guided Wave to Leaky Wave Acoustooptic Interactions in Proton-Exchanged LiNbO3 Waveguides*, IEEE Trans. on Ultrasonics, Ferroelectrics, and Frequency Control, 47(1), 16-28 (January 2000);

Smalley et al., Anisotropic leaky-mode modulator for holographic video displays, Nature, 498, 313-317 (20 Jun. 2013);

U.S. Pat. App. Publ. US 2014/0300695; Full Parallax Acousto-Optic/Electro-Optic Holographic Video Display;

Gneiting et al., *Optimizations for Robust, High-Efficiency, Waveguide-Based Holographic Video*, Industrial Informatics (INDIN), 2016 IEEE 14th International Conference on, (19-21 Jul. 2016);

Hinkov et al., Collinear Acoustooptical TM-TE Mode Conversion in Proton Exchanged Ti:LiNbO$_3$ Waveguide Structures, J. Lightwave Tech., vol. 6(6), pp. 900-08 (1988);

McLaughlin et al., Optimized guided-to-leaky-mode device for graphics processing unit controlled frequency division of color, Appl. Opt., vol. 54(12), pp. 3732-36 (2015);

Qaderi et al., Leaky-mode waveguide modulators with high deflection angle for use in holographic video displays, Opt. Expr., vol. 24(18), pp. 20831-41 (2016); and Savidis et al., Progress in fabrication of waveguide spatial light modulators via femtosecond laser micromachining, Proc. of SPIE Vol. 10115, (2017).

FIG. 1 shows an exemplary prior art SAW device or modulator 100. It can be used to deflect light of the same or different colors/wavelengths 101a, 101b, 101c from guided modes by different angles simultaneously, or serially, in time.

The modulator 100 comprises a substrate 120 in which or on which an optical waveguide 102 has been formed. The input light 101a, 101b, and/or 101c at one or more wavelengths ($\lambda_1$, $\lambda_2$, $\lambda_3$) enters waveguide 102. An in-coupling device 106 is used to couple the input light 101, possibly carried in an optical fiber, for example, into the waveguide 102. Examples of in-coupling devices 106 include in-coupling prisms, gratings, or simply butt-coupling to an optical fiber. The input light 101 is launched into a guided mode upon entry into the waveguide 102. Commonly, the TE (transverse electric) mode is guided.

In such a SAW modulator 100, the waveguide 102, e.g., slab waveguide, is typically created in a lithium niobate substrate 120 by proton-exchange. Transducers (e.g., interdigital transducers (IDTs)) 110 are written on an aluminum side of the substrate 120. The transducers 110 induce SAWs 140 in the substrate 120 that propagate along the waveguide 102. Such transducers 110 are often driven electrically, e.g., using a 300-500 MHz RF drive signal 130.

The light interacts with the surface acoustic wave 140. The result of this interaction between the SAW 140 and the light in the waveguide 102 is that a portion of the guided light is polarization-rotated, out of the guided mode and into a leaky mode having the transverse magnetic (TM) polarization. The light then exits the waveguide 102 as polarized leaky-mode or diffracted light 162 and enters substrate 120 at angle φ, measured from grazing 77. At some point this diffracted light 162 exits the substrate 120 at an exit face, which is possibly through the substrate's distal face 168 or end face 170 (as shown) as exit light 150 at an exit angle of θ. The range of possible exit angles θ comprises the angular extent, or exit angle fan, of the exit light 150.

Practical electronic constraints and materials properties often limit the resulting angular deflection of SAW devices. Qaderi (2016) reports that a total output angle of approximately 20° can be achieved, significantly lower than the field of view of contemporary 2D displays, which approaches 180°. Existing electro-holographic 3D displays using SAW devices have attempted to increase the exit angle fan of the diffracted output light 150 in various ways such as: by optimizing various modulator parameters to increase the useful bandwidth of the RF driver, e.g., waveguide depth and IDT design, by using edge-emitting modulators having "right-angle" edges, by doubling the angle fan via waveguides on both sides of the wafer, and/or by demagnification (i.e. using a large lens to demagnify an area of numerous modulators to provide a smaller visible display area having larger field of view). But it does not appear that any of these are adequate to achieve an angle fan as high as 90° in any sort of flat form-factor.

SUMMARY OF THE INVENTION

The present invention concerns electro-holographic light field generator devices. In these devices, multiple output couplers are employed. They might be distributed as a series along waveguides of the devices, within output coupling regions. Each of these output couplers can be configured for directing an incident leaky mode light at different output angles.

In some cases, it may be desirable to employ the output couplers to function as different sub-pixels, to provide light to different viewing directions. They can be used to increase the angular fan of the exit light.

The output couplers may be mirrors, volume gratings, chirped gratings, reflection gratings, two dimensional gratings, and/or transmission gratings. The output couplers may be angled so that the coupling output fans for each optical modulator are offset from the waveguide for that optical modulator. In addition or alternatively, the output couplers may be angled to address different fields of view in horizontal or vertical parallax using the same set of leaky mode output angles.

The input light may specifically be at least one of visible light, infrared light and ultraviolet light. In a specific example, each waveguide may be configured to handle a single wavelength of input light selected from the group of red, green and blue light, or each waveguide may be configured to handle multiple wavelengths of input light.

The output light field may also radiate from the proximal or distal face of the modulator substrate.

In general, according to one aspect, the invention features a light field generator device. The device comprises a device substrate, an array of waveguides formed in the substrate, one or more surface acoustic wave (SAW) transducers for generating a SAW in the substrate, and a set of output couplers for each of the waveguides.

In this way, light from each waveguide might be directed in different directions, depending on where along the length of the waveguide that it is ejected from the waveguide by the SAWs.

In different embodiments, multiple sets of output couplers could be provided for each of the waveguides. For example, the set of output couplers might comprise at least three output couplers at different angles with respect to the waveguide.

Each of the waveguides can have a separate SAW transducer or the SAW transducers might be shared among adjacent waveguides.

Different types of output couplers can be used. For example, in different implementations different combinations of volume gratings formed in the substrate, transmissive or reflective gratings, mirrors and so forth are employed.

Moreover, the output couplers can be rotated with respect to the waveguide to provide a light field with horizontal and/or vertical parallax.

In general, according to another aspect, the invention features a 3D display system comprising one or more light field generator devices, wherein each of the devices comprises a device substrate, an array of waveguides formed in the substrate, one or more surface acoustic wave (SAW) transducers for generating a SAW in the substrate, and a set of output couplers for each of the waveguides.

In general, according to another aspect, the invention features a method for generating a light field. This method comprises diffracting light out of waveguides with surface acoustic waves (SAWs) formed in a substrate; and directing the diffracted light with different output couplers arranged along the length of the waveguides.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIGS. 9A-9B are side cross-sectional views showing pixel sets of output couplers and a top view of a light field generator device according to another embodiment;

DETAILED DESCRIPTION OF THE PREFERRED EMBODIMENTS

Figure 1:
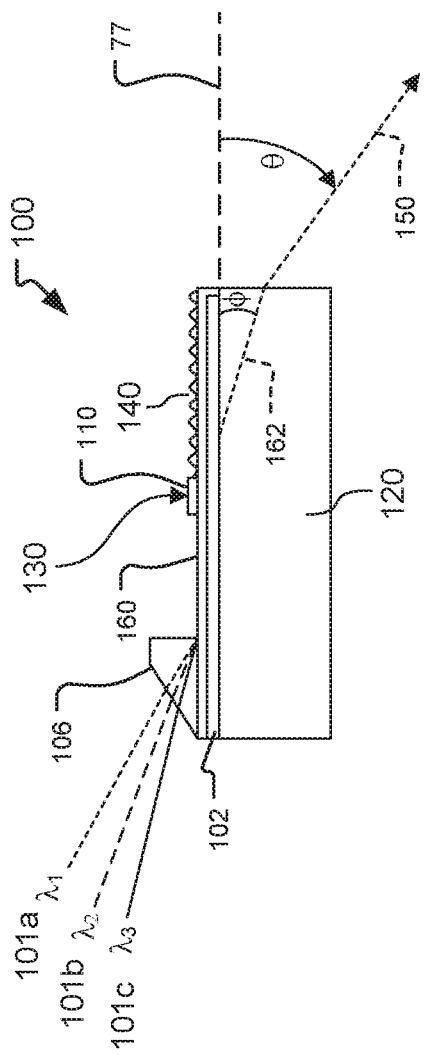
FIG. 1 shows a side cross-sectional view of a prior art SAW modulator.

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention can address different drawbacks of existing light field generators that are of particular importance to their use as 3D display systems, such as limited horizontal and vertical fields-of-view, limited display area, limited change in scene appearance with vertical observer motion, if at all.

Existing holographic displays also are bulky and complex. Embodiments of the present invention can enable the creation of 3D displays in a slim form factor of nearly any size, image quality, and viewing angle, as well as being compatible with vertical motion of the observer and/or enabling vertical parallax.

In general, several embodiments use volume gratings to expand the output fan produced by the SAW modulator to achieve a wide field of view. Volume gratings also can be used to directly incorporate vertical parallax. Alternative embodiments can deal with multiple colors (red, green, and blue—RGB), different grating configurations and types, and sending output through different device surfaces.

Figure 2A:
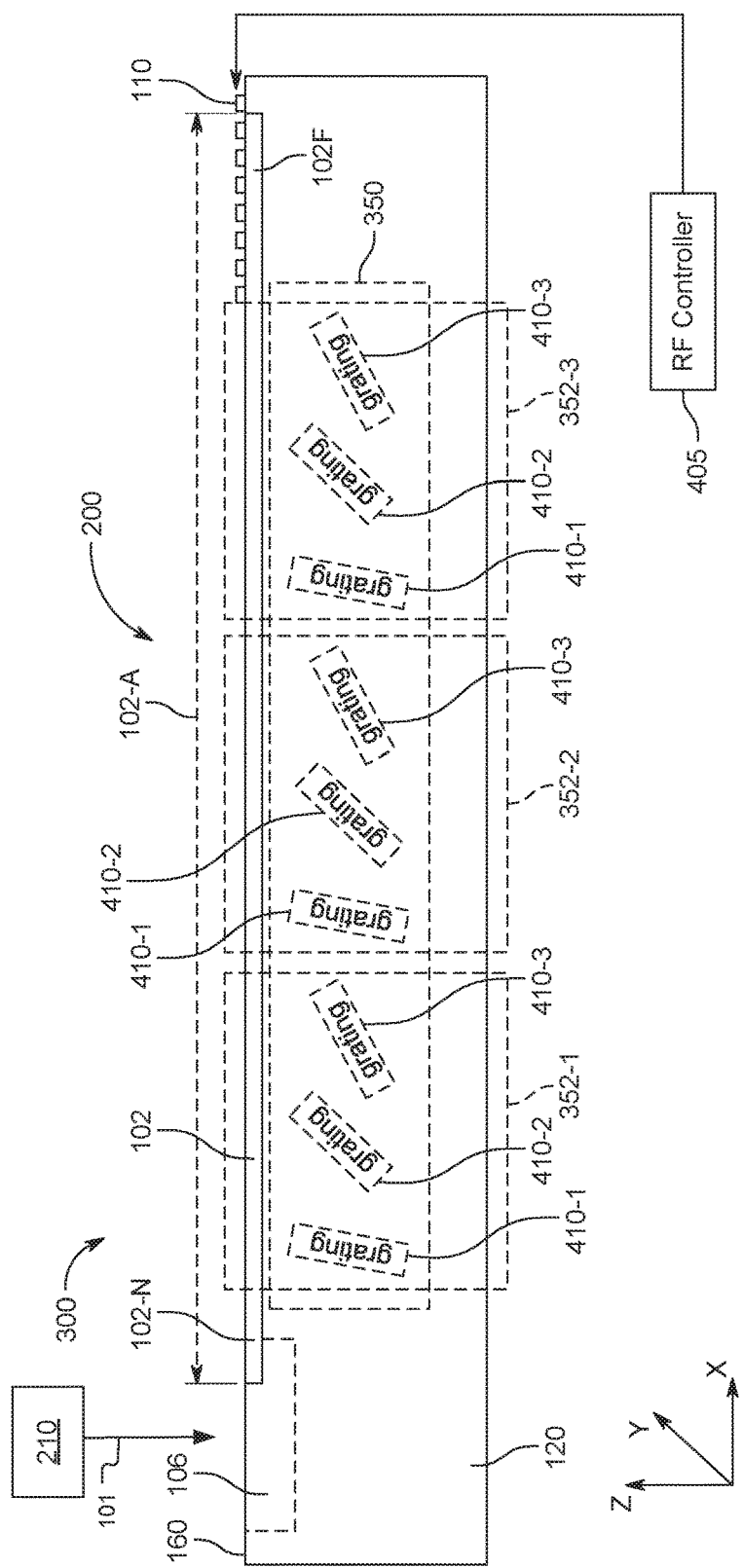
FIG. 2A is a side cross-sectional view showing an exemplary SAW modulator of a light field generator device according to the present invention.
Figure 2B:
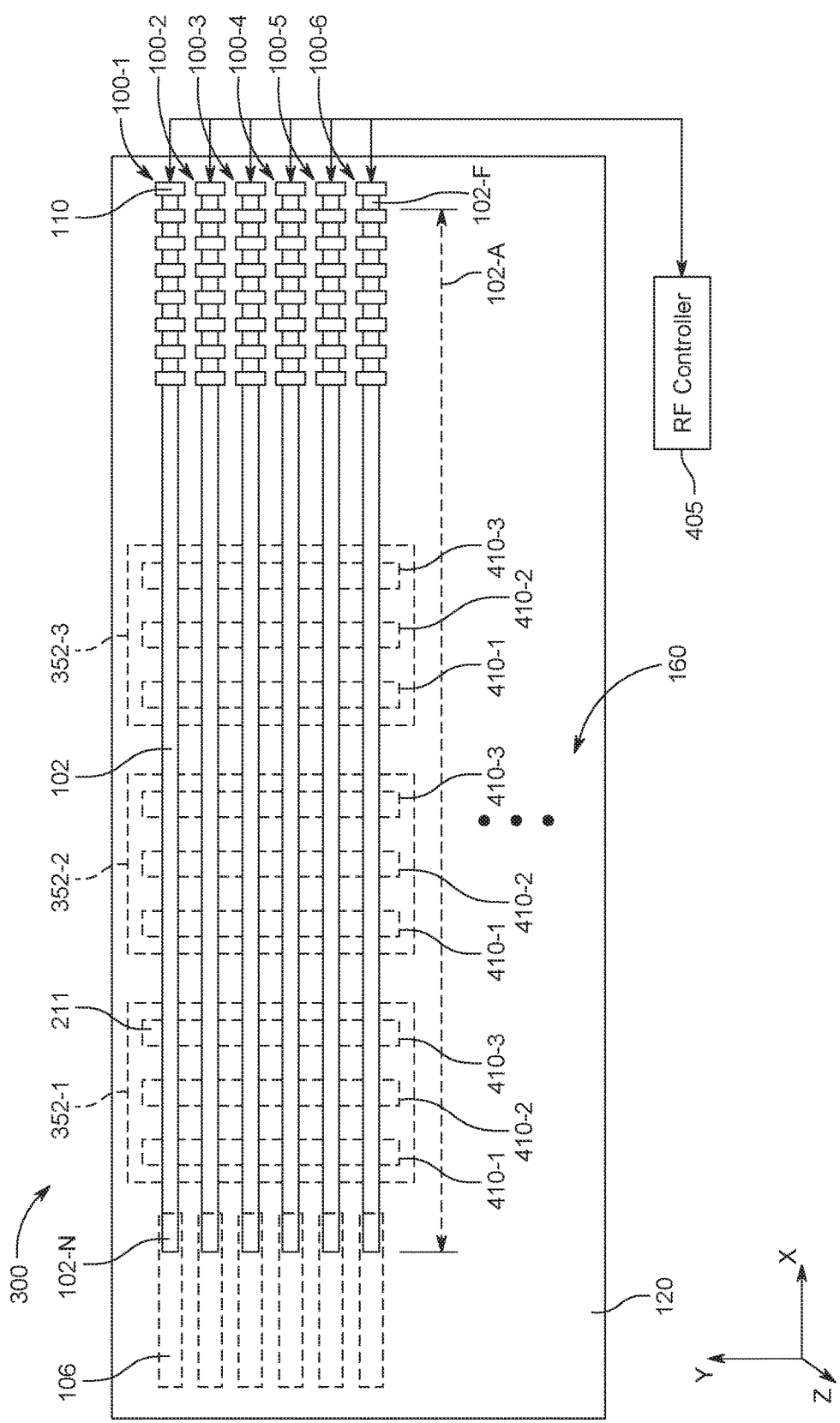
FIGS. 2B-2C are top views of light field generator devices according to two different embodiments of the present invention.
Figure 2C:
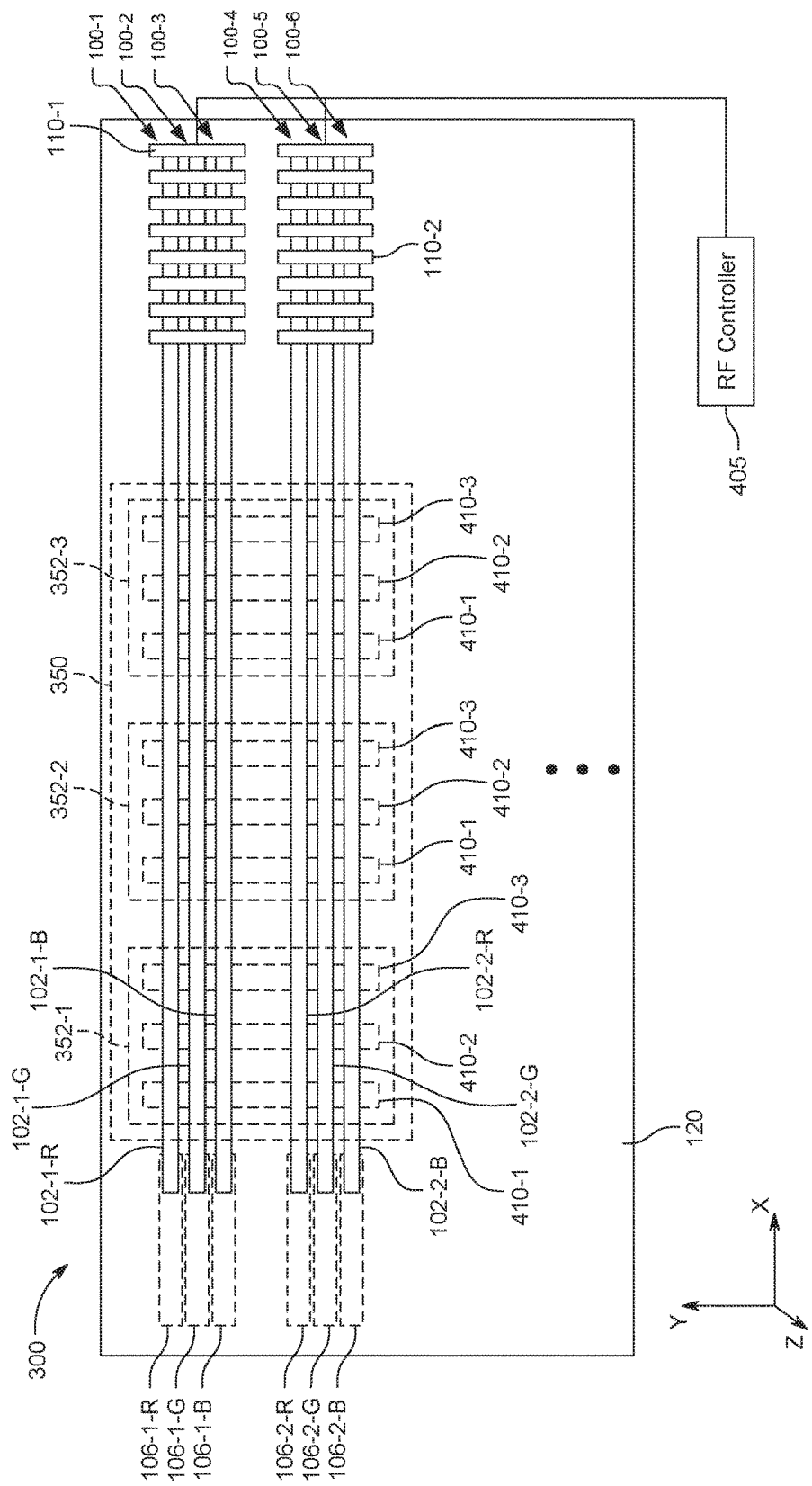

FIG. 2A shows a side cross-section showing the details of a SAW modulator and FIGS. 2B-2C show top views of electro-holographic light field generator devices 300 integrating arrays of the SAW modulators of FIG. 2A, according to embodiments of the present invention.

An optical substrate 120 has a proximal face 160 across which an array of optical modulators 100-1 to 100-6 are distributed. (In the illustrated embodiments, six explicit modulators 100 are shown. It should be noted, however, that in practice, especially for commercial devices, the optical substrate 120 will contain tens to hundreds, or more, of these modulators 100.) Each optical modulator 100 includes a waveguide 102 having opposing waveguide ends 102-N and 102-F, with respect to a longitudinal waveguide axis 102-A. At the near waveguide end 102-N, there is a light in-coupling device 106. At the far waveguide end 102-F, there is one or more surface acoustic wave (SAW) transducers 110. Usually the transducers are IDTs. Ordinarily, the number of IDTs per waveguide is small: usually just 1, or maybe 2-5 if high bandwidth is needed, or if "focusing" or "deflection in an unusual direction, such as with some "y" component" are needed. A typical IDT has 50-100 fingers in it, about 1-2 micrometers wide per finger.

The coordinate axes in the figures define the x-axis as the propagation direction of light in the waveguides 102. The proximal face 160 of the substrate 120 is parallel to the x-y plane. The z-axis is perpendicular to the proximal face 160. (Note that the use of coordinate axes herein may differ from the tradition of naming the axes in lithium niobate wafers. References elsewhere, for example, to "x-cut, y-propagating" lithium niobate and the like may be in terms of axes that are defined in different directions than those in the present figures.)

As mentioned before, the optical substrate 120 may be made, for example, of a suitable piezoelectric material such as lithium niobate (LiNbO3), quartz ($SiO_2$), or lithium tantalate (LiTaO3) following known processes (e.g., Smalley et al., 2013). These materials exhibit a birefringence property that allows for the convenient conversion of light into leaky modes and convenient polarization-based filtering of scattered light. Many other materials and design choices are available including other piezoelectric materials and crystallographic orientations, and waveguide architectures such as planar, ridge, rib, embedded, immersed, and bulged. Doping such as MgO-doped lithium niobate may be useful, in some cases. The optical substrate 120 may range in x- or y-dimensions of 1 centimeters (cm) (for near-eye display applications) to over 20 cm (for larger displays at larger viewing distances). Typically the thickness (z-dimension) of the optical substrate 201 ranges from 0.5 millimeters (mm) to 3 mm.

The light in-coupling device 106 (e.g., an optical grating or prism) couples input light 101 from an illumination source 210 into the waveguide 102 for TE-like (transverse electric) guided mode confinement of the input light within the waveguide 102. In a display application, the input light 101 is likely to be linearly polarized, and may be pulsed or continuous.

The SAW transducer 110 (e.g., an interdigital transducer (IDT) as described in Chen S. Tsai (ed.), Guided-Wave Acousto-Optics, pp. 91-204, Springer-Verlag (1990)) generates a SAW that propagates through the substrate 120. The transducer is typically designed such that the SAW will propagate collinear with the waveguide 102, copropagating or counter propagating with the light. Further, the generation of the SAW is timed with the light in the waveguide 102 to interact and convert a portion of that light to transverse magnetic (TM) polarization. Birefringence of the waveguide 120 and the optical substrate 120 (and/or the wave-vector change from the interaction) causes the deflection of a leaky mode fan of light out of the waveguide 102. The device is designed to have a defined output coupling region of the optical substrate 120.

The SAW transducers 110 typically are interdigital transducers (IDTs) fabricated from patterned metal films such conductive material including metals (e.g., aluminum, titanium, or gold), conductive polymers, or conductive oxides such as indium tin oxide (ITO). Patterning the SAW transducers may be performed though photolithography (etching or lift-off), laser ablation of metal film, or direct-writing techniques such as described in Datta et al, *Direct-laser metal writing of surface acoustic wave transducers for integrated-optic spatial light modulators in lithium niobate*, Proc. SPIE Adv. Fab. Tech. for Micro/Nano Optics and Photonics X, 10115 (2017). Each SAW transducer 110 is fabricated with separate drive signal connections allowing for each to be individually addressed by the RF control 405.

In different embodiments, the SAW transducers 110 can occupy a variety of specific locations and specific orientations with respect to their respective waveguide 102. In the illustrated embodiment, the SAW transducers 110 are located at the opposite, far end 102-F of the waveguides 102 from the in-coupling devices 106. Thus, the SAWS counter-propagate, in a direction opposite the propagation of the light in the waveguides 102. In other examples, however, the SAW transducers 110 can be located proximate to the near end 102-N of the waveguide 102, near the in-coupling devices 106. Then, the SAWS will propagate with the direction of light propagation in the waveguides 102. Moreover, there could be multiple SAW transducers 110 for each waveguide 102, with each SAW transducer 110 responsible for a different specific bandwidth around a given center frequency (e.g., 100-200 MHz, 200-300 MHz, and 300-400 MHz).

For each optical modulator 100-1 to 100-6, there are multiple output couplers 410. In the illustrated embodiment, the output couplers 410 are distributed along the length of the waveguide 102. Specifically, the output couplers 410 are located within output coupling region 350, and divided into different pixel sets 352-1 to 352-3, to reflect the leaky mode fan of diffracted light as an output fan out from the optical substrate 120 at different output angles towards a display viewer. Specifically, the first pixel set 352-1 comprises three output couplers 410-1, 410-2, 410-3. Each of these three output couplers 410-1, 410-2, 410-3 is rotated around the y-axis to be angled at a different angle with respect to the x-axis such that they direct the leaky mode light into a different range of angles with respect to the proximal face 160. The second pixel set 352-2 and the third pixel set 352-3 each comprise a similar set of three output couplers 410-1, 410-2, 410-3.

Figure 3:
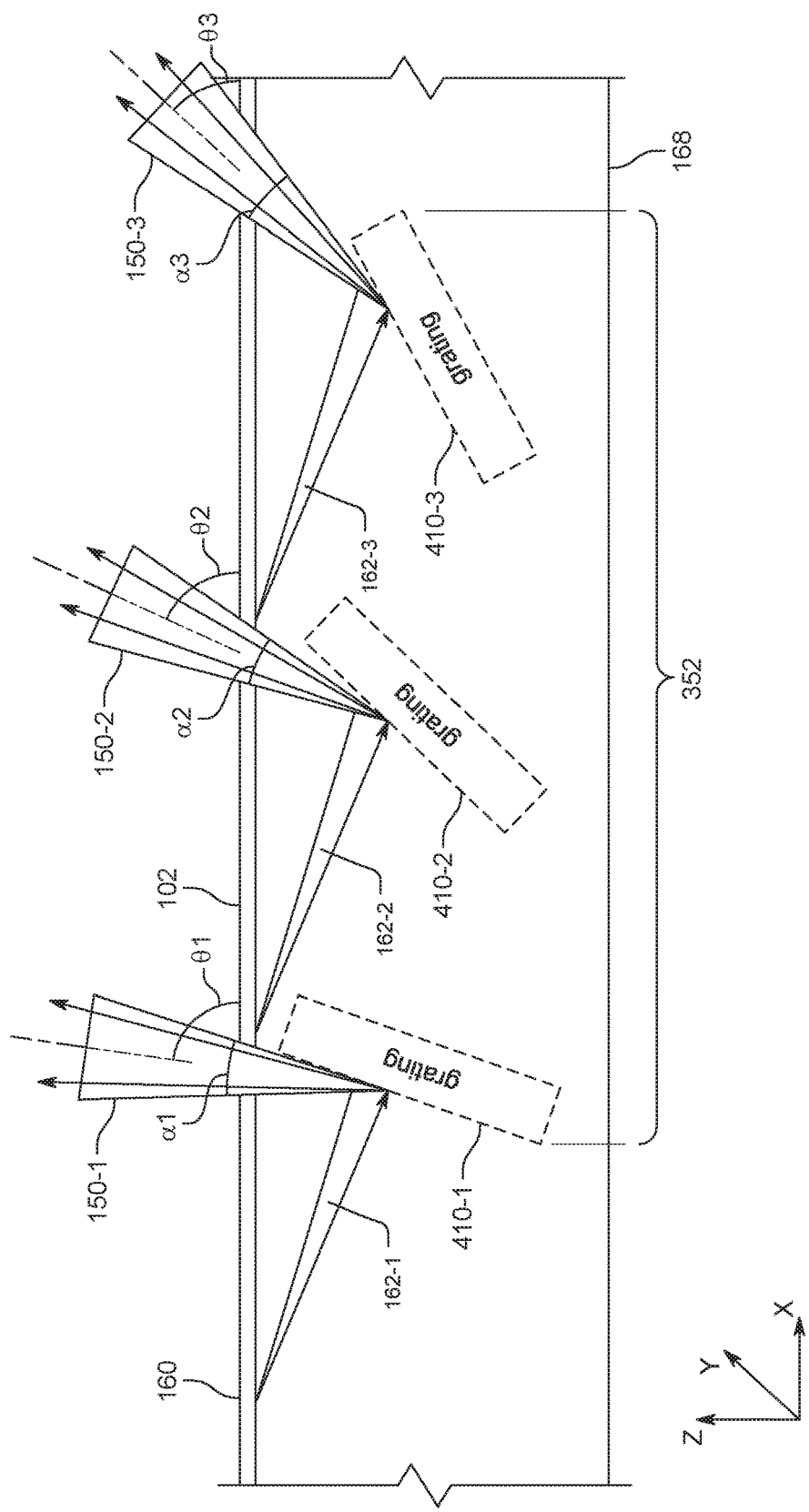
FIG. 3 is a side cross-sectional view showing a pixel of output couplers of a SAW modulator.

FIG. 3 shows structural detail of a portion of a side cross-section of a light field generator device showing that a pixel set 352 of output couplers 410 for a given optical modulator 100. These output couplers are configured to reflect the leaky mode fans of diffracted light 162-1 to 162-3 diffracted 150-1, 150-2, 150-3 from the waveguide 102 to produce multiple output fans 150-1, 150-2, 150-3 at possibly different specific coupling output angles (θ1, θ2, θ3) and possibly different grating angular fan widths (α1, α2, α3).

Returning back to FIGS. 2A-2C, and as best shown in FIGS. 2B-2C, the electro-holographic light field generator devices 300 each comprises an array of SAW devices or modulators 100-1 to 100-6. These SAW devices 200 are fabricated in the common substrate 120. The longitudinal axes of each of these SAW devices 200 extend parallel to each other across the light field generator device 300 in the x-axis direction.

The array of surface acoustic wave (SAW) optical modulators 100 is arranged in the y-axis direction across the width of the common substrate 120. Each SAW optical modulator 100 includes an in-coupling device 106 (e.g., a laser in-coupling grating or prism), a waveguide 102 and a SAW transducer 110 (e.g., an IDT, for example).

It should be also noted in different embodiments, the in-coupling devices may be shared between multiple waveguides 102 or a separate in-coupling device provided for each of the waveguides 102. Moreover, as shown in FIG. 2B, there may be a separate a SAW transducer 110 for each waveguide 102. However in other examples, as shown in FIG. 2C, the SAW transducers 110 may be shared between groups of waveguides: SAW transducer 110-1 is shared between SAW modulators 100-1, 100-2, 100-3, and SAW transducer 110-2 is shared between SAW modulators 100-4, 100-05, 100-6.

An RF controller 405 includes at least one hardware implemented processor device, which is controlled by software and/or firmware instructions to translate a desired 3D image into an appropriate RF drive waveform 130 that is applied to the SAW transducer 110 of each optical modulator 100-1 to 100-6. In one application, the RF drive waveforms would be created to combine the coupling output fans 150 together into a combined output light field from the modulator's proximal face 160 with a net output fan angular width defined by combining the separate grating angular fan widths from each of the separate output couplers 410. Software for driving electro-holographic displays of a variety of forms is described, for example, in Mark Lucente, *Computational holographic bandwidth compression*, IBM Systems Journal, 35(3 & 4), 349-365 (1996); Quinn et al., *Interactive holographic stereograms with accommodation cues*, Practical Holography XXIV: Materials and Applications, ed. Hans I. Bjelkhagen and Raymond K. Kostuk, SPIE (2010); and Jolly et al., *Computation of Fresnel holograms and diffraction-specific coherent panoramagrams for full-color holographic displays based on leaky-mode modulators*, Proc. SPIE Practical Holography XXIX, 9386, 93860A (Mar. 10, 2016); all of which are incorporated herein by reference in their entireties.

The output light field may include video display pixels, and the RF controller 212 may be configured to operate the light input and the SAW transducer of each optical modulator such that each display pixel is associated with a pixel set 352 of adjacent output couplers 412.

For example, as shown in FIGS. 2A-2C, each individual output coupler 412 may be operated as a sub-pixel element (typically 100 μm). The output coupler 412 of each pixel set 52 is oriented at a different angle or designed with a different grating periodicity such that it addresses a different set of coupling output angles θ from the device 300. Multiple output couplers 412 are then operated together as a pixel set 352 (typically 1 millimeter (mm)) to display a single pixel in the output light field. The size of a single pixel is determined by the desired display resolution, for example 1 mm×1 mm (or in the range of 100 μm×100 μm to 2 mm×2 mm).

Once the RF controller 405 determines how much light needs to be put into a given view of a given pixel, it then determines what RF waveforms needs to be applied to the SAW transducers 110 to produce that outcome. For example, the RF controller 405 may do a computational back-propagation of that light via the output couplers 412 and back into the corresponding waveguide 102. The computational interference between that back-propagated light and the waveguide light finally determines a specific SAW waveform to be generated by the SAW transducer 110. In specific embodiments, the back-propagation can be pre-computed into a lookup table.

Dimensions of the device 300 are defined by the desired properties of the optical modulators 100. The waveguides 102 are typically about 10 μm (typically 1-200 μm) in diameter (along the x-axis) and about 1 μm in thickness (typically 0.1-10 μm). The waveguides 102 should be spaced sufficiently to avoid interactions by evanescent coupling, but also should be spaced sufficiently closely to provide a large active area on the device 300, typically about 2-1000 μm center to center, e.g., 50 μm. The length of the waveguides 102 can vary depending on the number of display pixels they address and the optical and acoustic wave losses, typically 1 mm to 10 cm in length (e.g. 5 cm). Longer waveguides help reduce grout, reduce electronic complexity, and increase active area of the device.

Each waveguide 102 may be configured for single specific wavelength of input light, which in this context should be understood to include at least one of visible light, infrared light and ultraviolet light, or for multiple different light wavelengths. For example, for 3D display applications, each waveguide 102 may carry one or more of infrared, red, green, blue or ultraviolet light. In other specific light field generation applications, other wavelength combinations may be useful including more or fewer than three colors and/or non-visible wavelengths.

Several methods exist to produce volume gratings suitable for the output couplers 410. For volume gratings with planar index modifications (index modulation along the grating normal only), interference effects when irradiating with ultraviolet light can be used. Direct laser writing (Gattass and Mazur, *Femtosecond laser micromachining in transparent materials*, Nature photonics 2.4 (2008): 219-225; Savidis et al, *Progress in fabrication of waveguide spatial light modulators via femtosecond laser micromachining*, Proc. of SPIE Vol. Vol. 10115, 2017) can be used to fabricate gratings with index variations along both the grating normal and in the plane of the grating, allowing magnification of the output fan of light. Alternatively, volume gratings may be fabricated, for example and without limitation, by etching directly into/onto the optical substrate, depositing metal dots or lines, or depositing dielectric dots or lines or pillars. Descriptions of exemplary generic algorithms and numerical grating optimization techniques may be found in:

Zhou et al., Genetic local search algorithm for optimization design of diffractive optical elements, Appl. Opt., vol. 38(20), pp. 4281-90 (1999);

Lin et al., Optimization of random diffraction gratings in thin-film solar cells using genetic algorithms, Solar Energy Materials and Solar Cells, vol. 92(12), pp. 1689-96 (2008);

Qing et al., Crowding clustering genetic algorithm for multimodal function optimization, Appl. Soft Computing, vol. 8(1), pp. 88-95 (2008);

Taillaert et al., Compact efficient broadband grating coupler for silicon-on-insulator waveguides, Opt. Lett., vol. 29(23), pp. 2749-51 (2004);

Shokooh-Saremi et al., Particle swarm optimization and its application to the design of diffraction grating filters, Opt. Lett., vol. 32(8), pp. 894-96 (2007); and Byrnes et al., Designing large, high-efficiency, high-numerical-aperture, transmissive meta-lenses for visible light, Opt. Exp. 24 (5), pp. 5110-5124 (2016).

Arrangements such as those described herein for improved SAW optical modulator devices address several shortcomings of previous designs. First, the device can be surface (perpendicular to the x-y plane) emitting, enabling a large active display area with a thin form factor device. Second, typical waveguide leaky mode fan widths are on the order of several degrees. By addressing different sets of angles with different sub-pixels and different output couplers, the angular width of the narrow leaky mode fan can be multiplied. Third, typical volume gratings can only efficiently diffract light incident within 2-3 degrees of the Bragg angle (see Jolly et al., *Near-to-eye electroholography via guided-wave acousto-optics for augmented reality*, SPIE Photonics West (2017), p. 101270J), which limits the field of view achievable by a wide waveguide output fan diffracted from a volume grating. In discussion above, each sub-pixel output coupler is configured with the proper acceptance and diffraction angle to address a different portion of the modulator's total field of view.

Figure 4:
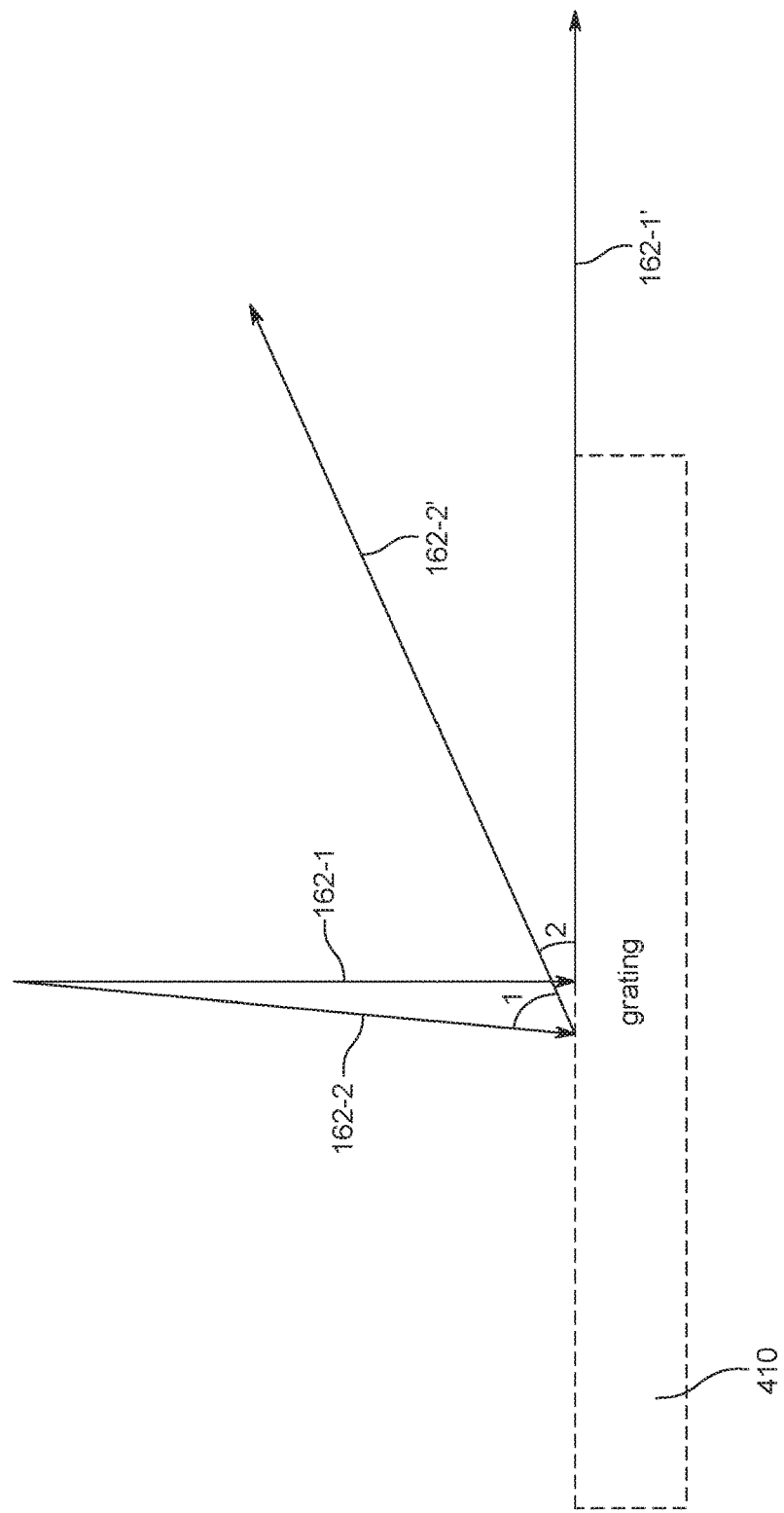
FIG. 4 is a schematic side view illustrating the principle of magnification of waveguide output fan.

FIG. 4 illustrates the principle of magnification of the grating angular fan widths due to grating incident angle. This allows multiple output couplers 410 to expand a narrow leaky mode fan of the diffracted light 162 from the waveguide 102 into a wide field of view output light field 150 from the device 300. In the example shown for output coupler 410 with a grating order m=1 and grating period d=Λ (in the grating plane) equal to the wavelength of incident light, a first light ray 162-1 incident along the grating normal will be diffracted (see 162-1') at 90 degrees from the normal, while a second light ray incident 162-2 at 5 degrees from the grating normal will be diffracted (see 162-2') at 66 degrees from the normal. Thus a leaky mode exit fan with an angular width of 5 degrees incident along a direction close to the grating normal can be expanded to a coupling output fan with a 24 degrees grating angular fan width.

Figure 5A:
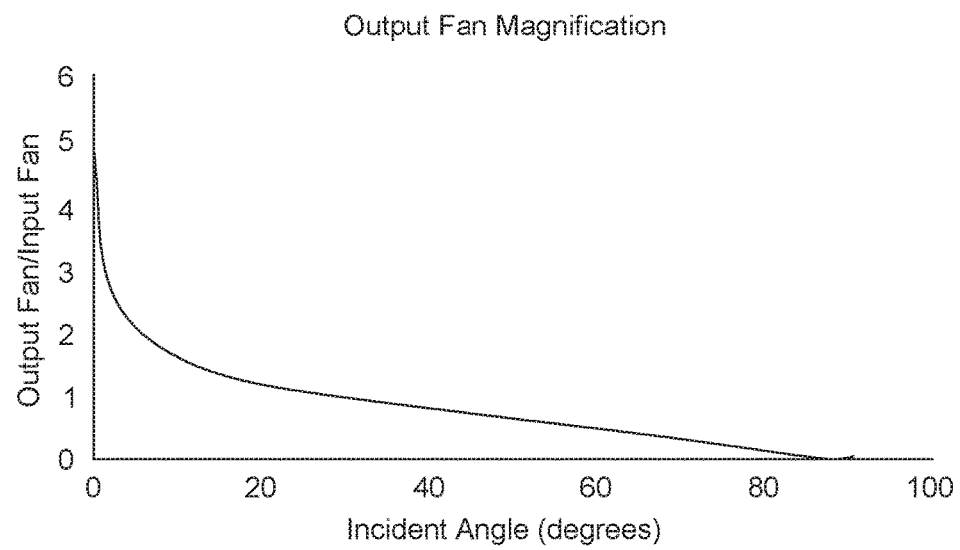
FIGS. 5A-5B are plots of output fan magnification as a function of incident angle in degrees and angular spread in degrees as a function of incident angle in degrees, respectively.
Figure 5B:
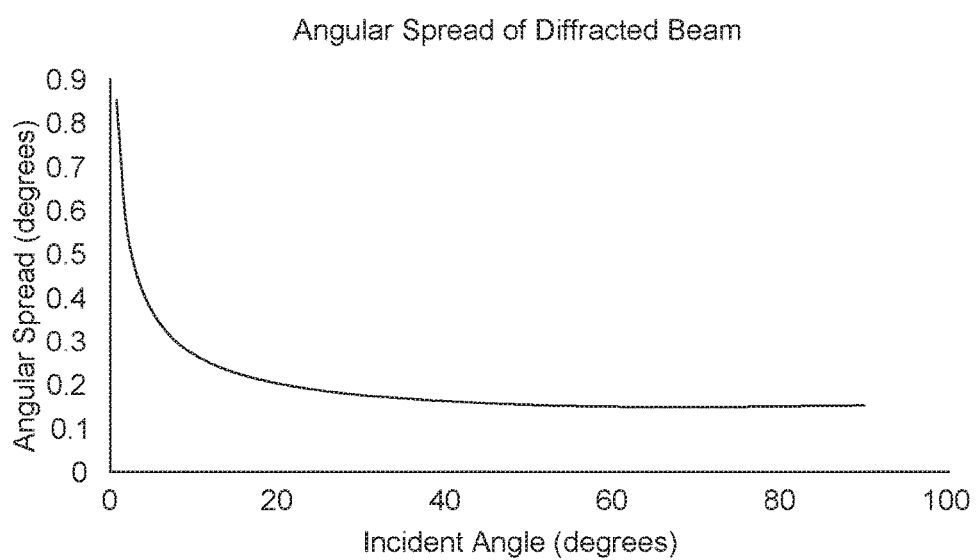

FIGS. 5A-5B show graphed data for magnification of the waveguide output fan (output fan width/waveguide leaky mode fan width) as a function of incident angle on the grating output coupler 410 and angular spread of the diffracted beam as a function of incident angle on the grating for a 100 μm long grating. It can be seen that output fan magnification involves a trade-off. Expanding the output fan also results in greater angular spread of the diffracted light, limiting the number of non-overlapping "views" that can be produced by the modulator. Angular spread is the divergence of a diffracted ray of light at a particular wavelength and exit angle due to a finite length of the grating being illuminated.

The size of individual sub-pixel element output couplers 410 is defined by the tolerable angular spread of the output light field. To ensure one view per degree in horizontal parallax, typical sub-pixel element output couplers will be at least 100 μm in length (along the x axis), for example, between about 10 μm to 1 mm in length depending on the specific requirements of the optical modulator. The light pulse width also may be related to the sub-pixel size and spacing to ensure that the leaky mode fans produced by the SAW modulation signal from the waveguide enters the correct output coupling pixel. For example, the maximum illumination pulse width might be $D_{output\ couplers}/V_{sound}$ (approximately 25 nanoseconds (ns) for 100 micrometer spacing between output couplers for 4000 meters per second (m/s) sound velocity in $LiNbO_3$).

Figure 6A:
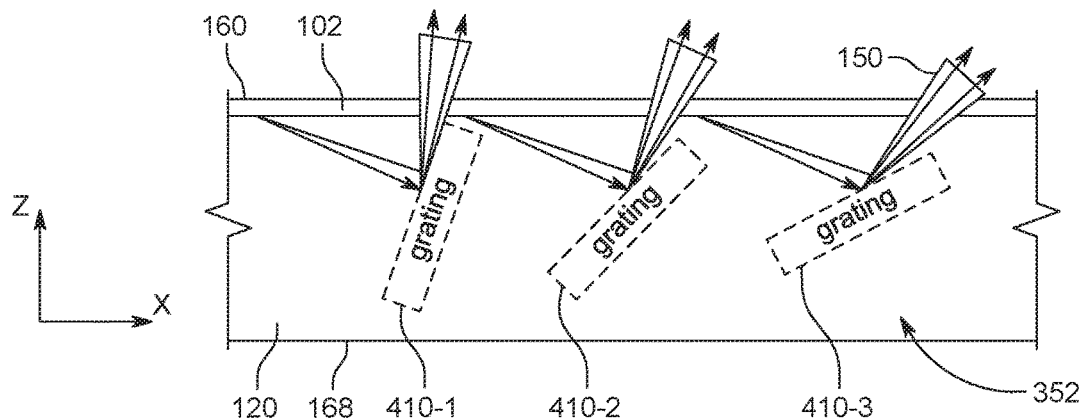
FIGS. 6A-6C are side cross-sectional views showing pixel sets of output couplers according to different embodiments.
Figure 6B:
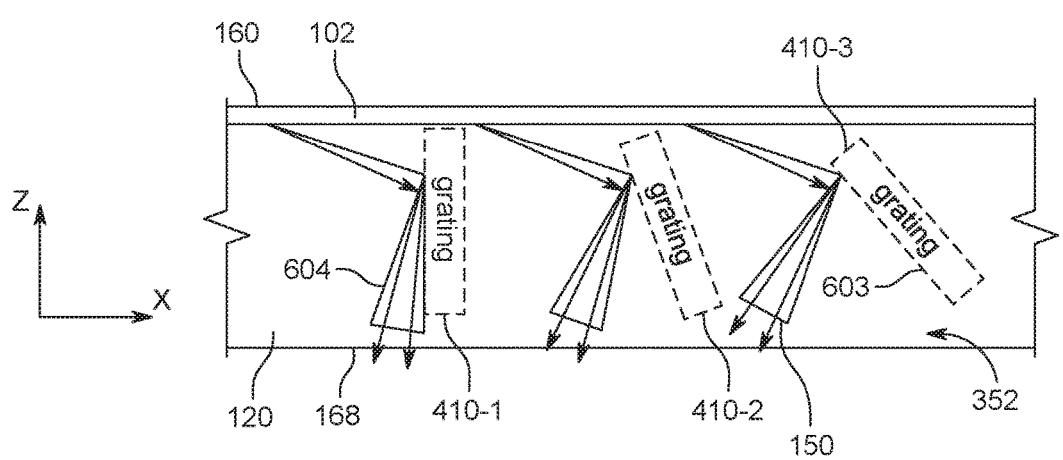
Figure 6C:
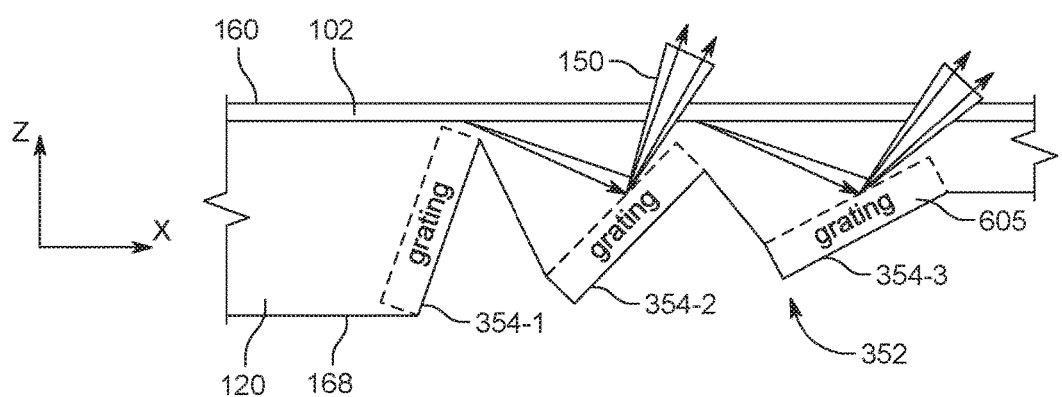

Grating output couplers 410 can be arranged in several different reflection configurations as shown in FIGS. 6A-6C.

In one example, the grating output couplers 410 for the pixel set 352 are volume gratings formed in the bulk of the substrate 120. They are angled to reflect the output fan 150 through the proximal face 160 of the substrate 120 as shown in FIG. 6A.

In another example, the volume gratings output couplers 410 are angled to reflect the output fan 150 out the distal face 168 of the substrate 120 as shown in FIG. 6B.

Alternatively, two dimension surface or volume gratings 410 can be fabricated or adhered to sides of trenches 354 formed on the distal face 168 of the substrate 120, as shown in FIG. 6C. In this example, the output couplers reflect the output fan 150 out the proximal face 160 of the substrate 120.

Figure 7A:
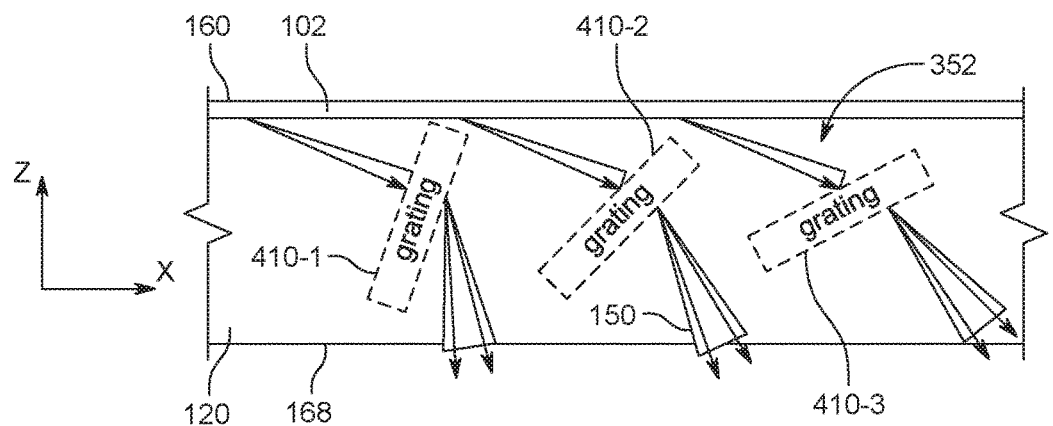
FIGS. 7A-7B are side cross-sectional views showing pixel sets of output couplers according to different embodiments.
Figure 7B:
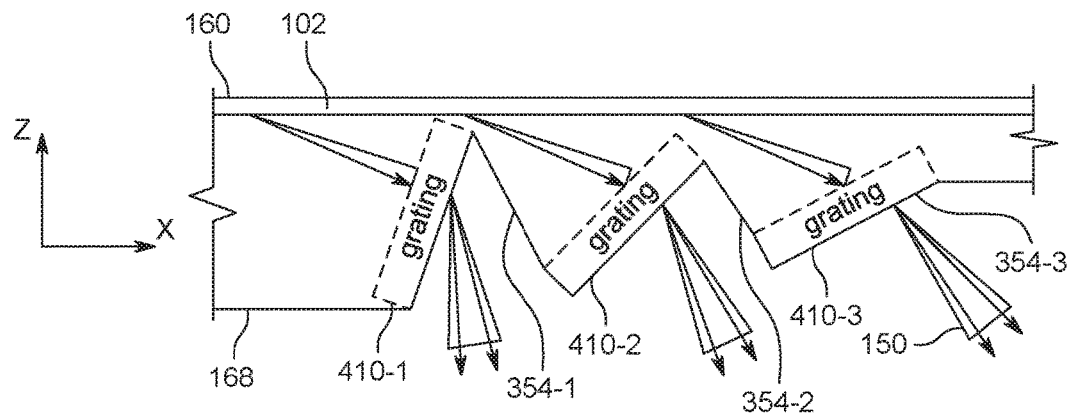

Alternatively, gratings can be arranged in several transmission configurations, as show in FIG. 7A-7B.

In one example, the volume gratings output couplers 410 are formed in the bulk of the substrate 120 and are designed to diffract the output fan 150 through the distal face 168 of the substrate 120, as shown in FIG. 7A.

Alternatively, 2D or volume grating output couplers 410 can be fabricated or adhered on the distal face 168 of the substrate 120 in trenches 354 to transmit the output fan 150 through the distal face 168 of the substrate 120 as shown in FIG. 7B.

Reflective output couplers could specifically be reflective surfaces (i.e. mirrors) or refractive elements, within or on the surface of the substrate. See, for example, Ulrich and Martin, *Geometrical Optics in Thin Film Light Guides*, Appl. Opt. 10, 2077-2085, September 1971. In the case of tilted volume or 2D gratings fabricated on or adhered to the distal face 168 of the substrate 120, the correct angle is cut into the substrate 120 in the form of the trenches 154 for the angled gratings, for example, using an angled etch, surface milling, or processes such as laser ablation.

The output coupling gratings 410 need not be fabricated directly into the bulk or surface of the SAW substrate 120 (e.g., the LiNbO$_3$ wafer that the waveguides are defined in). For example, in an alternative the output coupler 410 are fabricated in the bulk or on the surface of a high-index polymer, glass, or crystal transparent substrate, which is then bonded to the SAW substrate 120 containing the waveguides and other modulator components. Preferably, the material should be closely index-matched to the substrate 120 (e.g., LiNbO$_3$). Fabrication can be performed in a non-birefringent material, greatly simplifying the process of direct laser writing to produce grating structures (distortions of the focused beam spot caused by focusing in birefringent materials such as LiNbO$_3$ can reduce the resolution of structures). Additionally, this would allow the use of materials, such as polymers, that can be molded to have angled surface facets.

An advantage of sending the output fan 150 out via the distal face 168 of the substrate 120 is to avoid passing through the proximal face 160, which contains the waveguides 102, the in-coupling devices 106, and SAW transducers 110. These structures can all create additional scattering of the output fan light.

Figure 8:
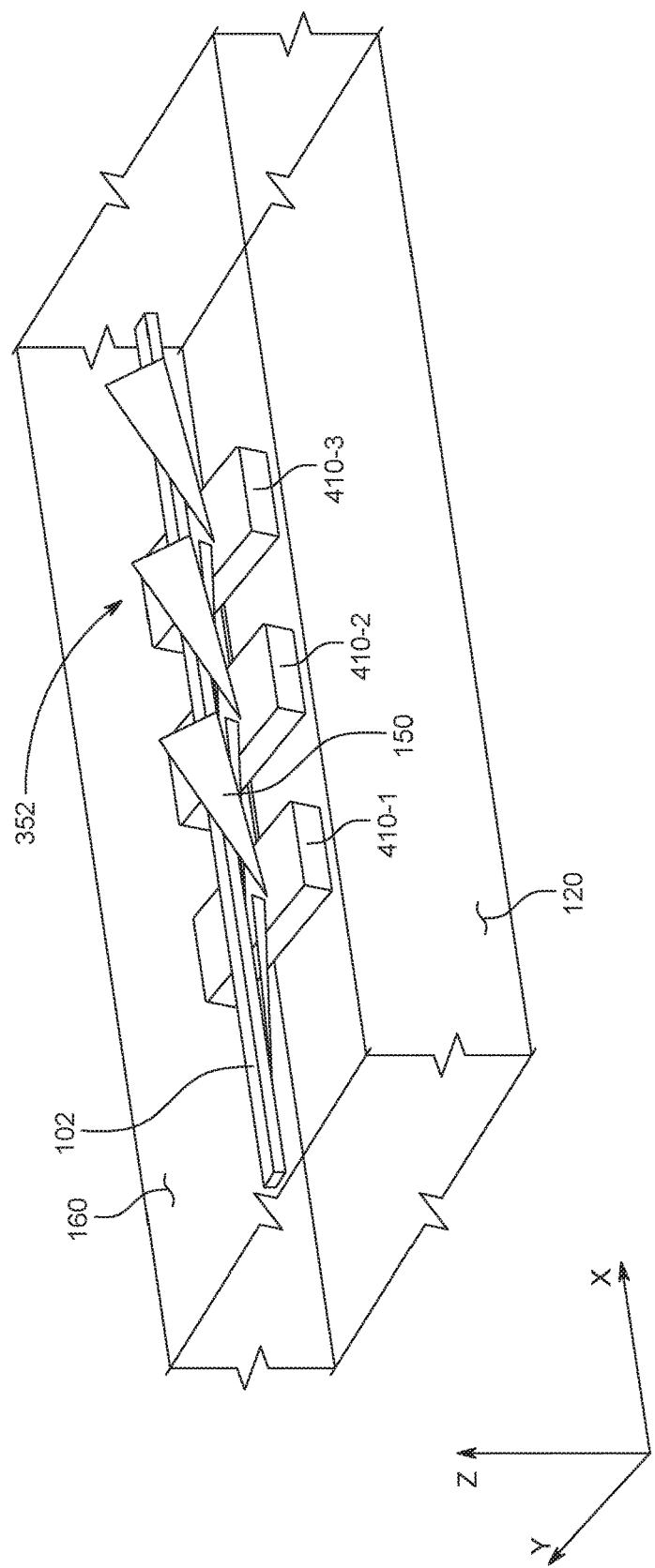
FIG. 8 is an elevated perspective view of a pixel set of output couplers according to an embodiment.

Alternatively, as shown in FIG. 8, reflective output couplers 410 of a pixel set 352 can be rotated slightly about the x-axis to send the output fan 150 out of the top surface of the modulator and to one side of the waveguide 102.

Handling multiple wavelengths, for example RGB, in the same device can be done with many different designs, such as shown in FIGS. 9A-9B. The grating output couplers are highly wavelength sensitive, and the diffracted angles for gratings differ as a function of incident wavelength. Volume gratings also have different acceptance angles for different wavelengths.

FIG. 9A shows an embodiment that uses separate output couplers 410-1, 410-2, 410-3 for different color output fans 150-R, 150-G, 150-B. This can be advantageous, at the cost of display active area. The output couplers 150-R, 150-G, 150-B for separate colors are arranged along the length of the same waveguide 102 (if all wavelengths are propagating in the same waveguide).

FIG. 9B shows an embodiment that uses separate waveguides for each of the different colors. In the illustrated embodiment, there are three in-coupling devices 106-R, 106-G, 106-B that couple each of the primary colors into a separate waveguide 102-R, 102-G, 102-B. Then, within the pixel set 352 of gratings, there is a separate grating for each color and for each sub pixel. For example, for red light that is traveling in waveguide 102-R, there are three output couplers 410-1-R, 410-2-R, 410-3-R that would each direct light at a different angle. A similar set of gratings is provided for each of the other waveguides 102-G, 102-B, as shown.

Figure 10A:
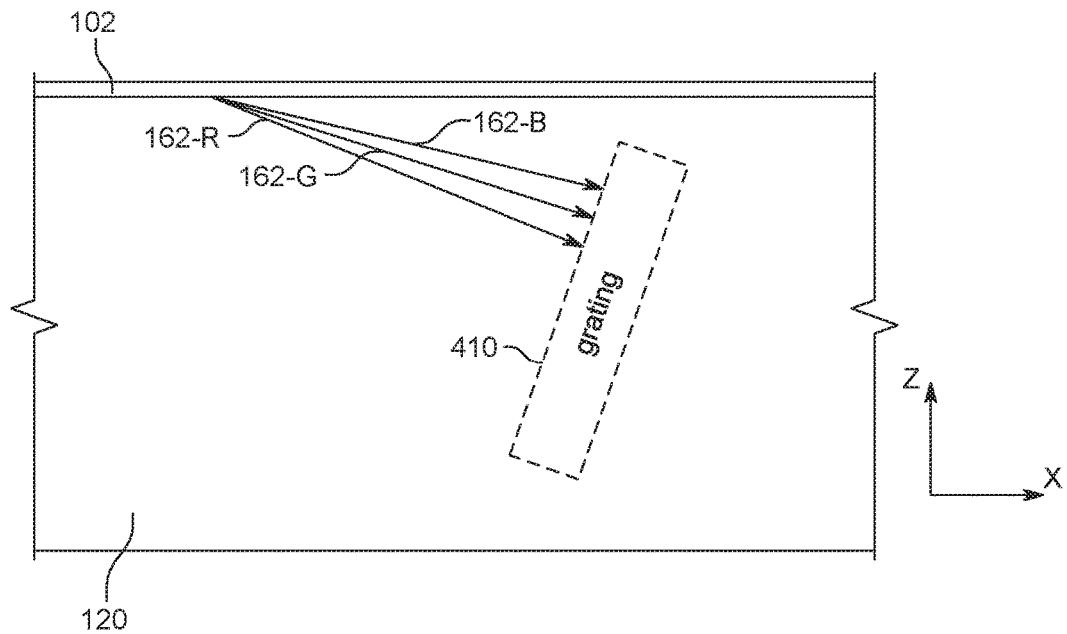
FIGS. 10A-10B are side cross-sectional views showing different output couplers.

FIG. 10A shows an embodiment where the same volume grating output coupler 410 is used for all the operating wavelengths 162-R, 162-G, 162-B. In that case, the frequency of the SAW 140 for each wavelength must be adjusted to eject light from the waveguide 102 into the acceptance angle of the volume grating 410 for that wavelength.

Figure 10B:
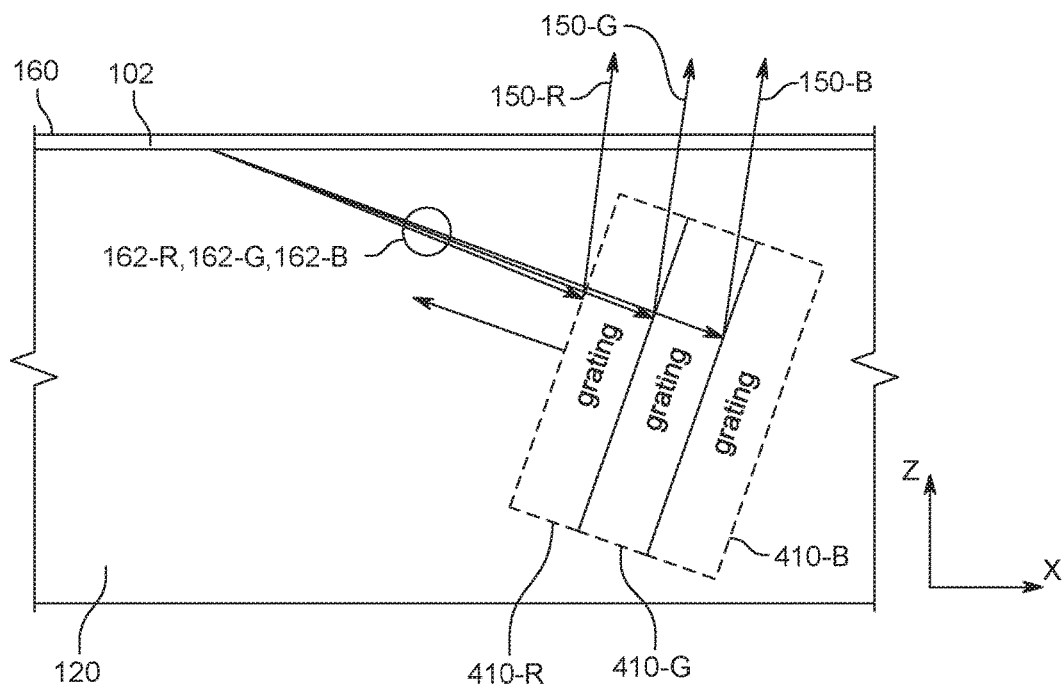

Alternatively, as shown in FIG. 10B, because volume gratings are highly wavelength/angle selective, a single output coupler can be chirped with layer spacing that is along the grating normal to produce regions of high diffraction efficiency for red, green and blue, output fans. The result is that a different output coupler 410-R, 410-G, 410-B is effectively provided for each of the separate wavelengths or primary colors 162-R, 162-G, 162-B that are diffracted from the same waveguide 102. This chirped grating architecture can be designed to efficiently diffract light at different depths for different wavelengths. Wavelengths that are incident on a layer of the chirped grating that is off of the acceptance angle will pass through the output coupler with very low diffraction efficiency. Spacing of chirped gratings in the grating plane also can be varied as a function of depth to produce the desired diffraction angle out of the device for each wavelength.

Figure 11:
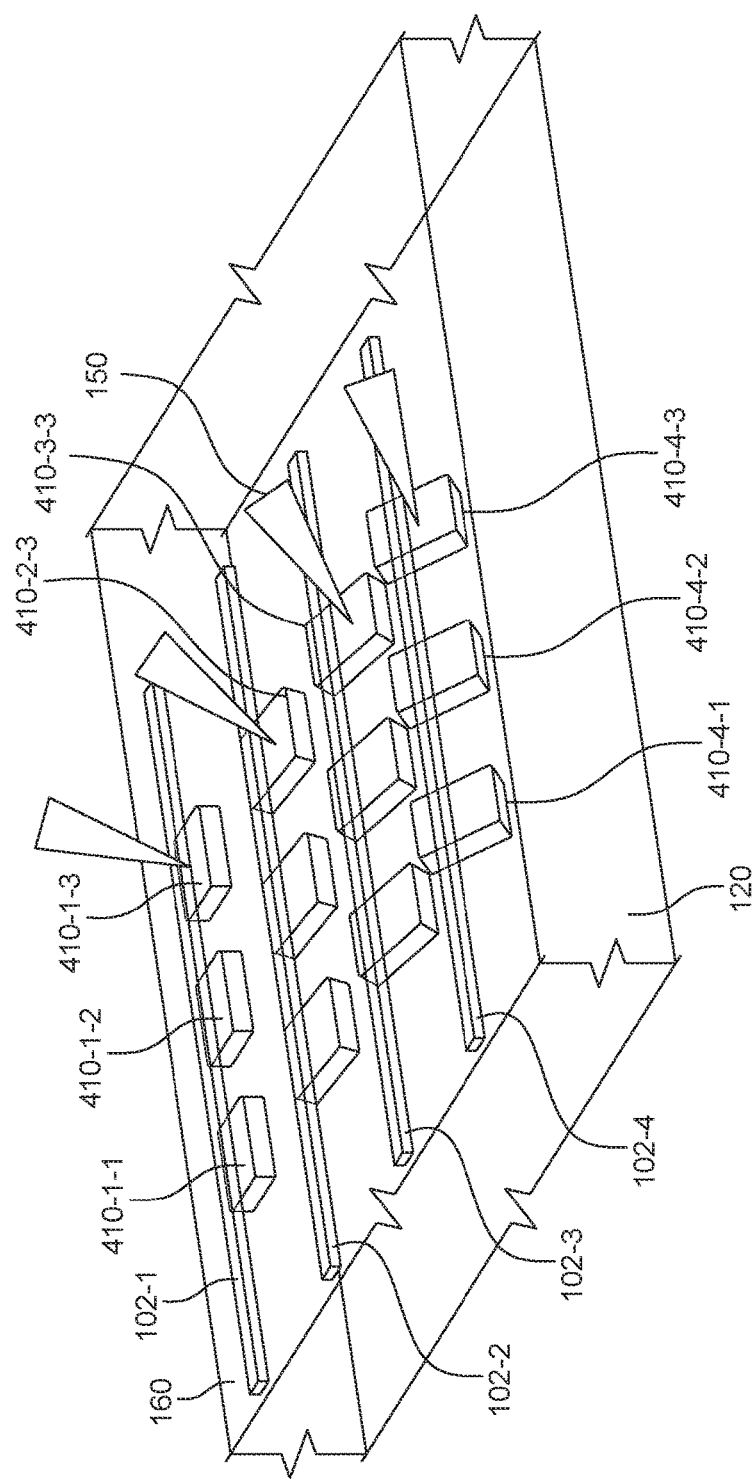
FIG. 11 is an elevated perspective view of pixel sets of output couplers for a group of waveguides of an embodiment of a light field generator device.

Vertical parallax can also be readily incorporated with the device geometry, which could enable a larger number of fields of view. FIG. 11 shows structural detail of a portion of an elevated perspective of a light field generator device 300 that can address the vertical parallax. If the display pixels typically measure 1 mm×1 mm, the waveguides are spaced by 50 µm, and separate waveguides are used for RGB, then there can be six sets of waveguides per pixel. Sub-pixel output couplers 1101 distributed along each waveguide (along the x-axis) can be rotated about the y-axis to address a wide field of view for horizontal parallax. And the output couplers 410 for each set of waveguides are then rotated at different angles about the x-axis to address different views for vertical parallax. A greater number of views for vertical parallax can be achieved by fabricating waveguides 102 closer together, at the expense of increased angular spread of the output light 150 from the gratings 410. Alternatively, larger pixels could contain more sets of waveguides and gratings, sacrificing display resolution in order to address more views and a larger range of angles for vertical parallax.

Note that in the specific embodiments depicted earlier such as in FIGS. 2B and 2C, the output coupling regions are depicted as being continuous column features within the substrate. But as can be seen here, that is not necessary. As shown in FIG. 11, the output couplers 410 may be separate individual features within the optical substrate 120 that are disconnected from each other.

Figure 12:
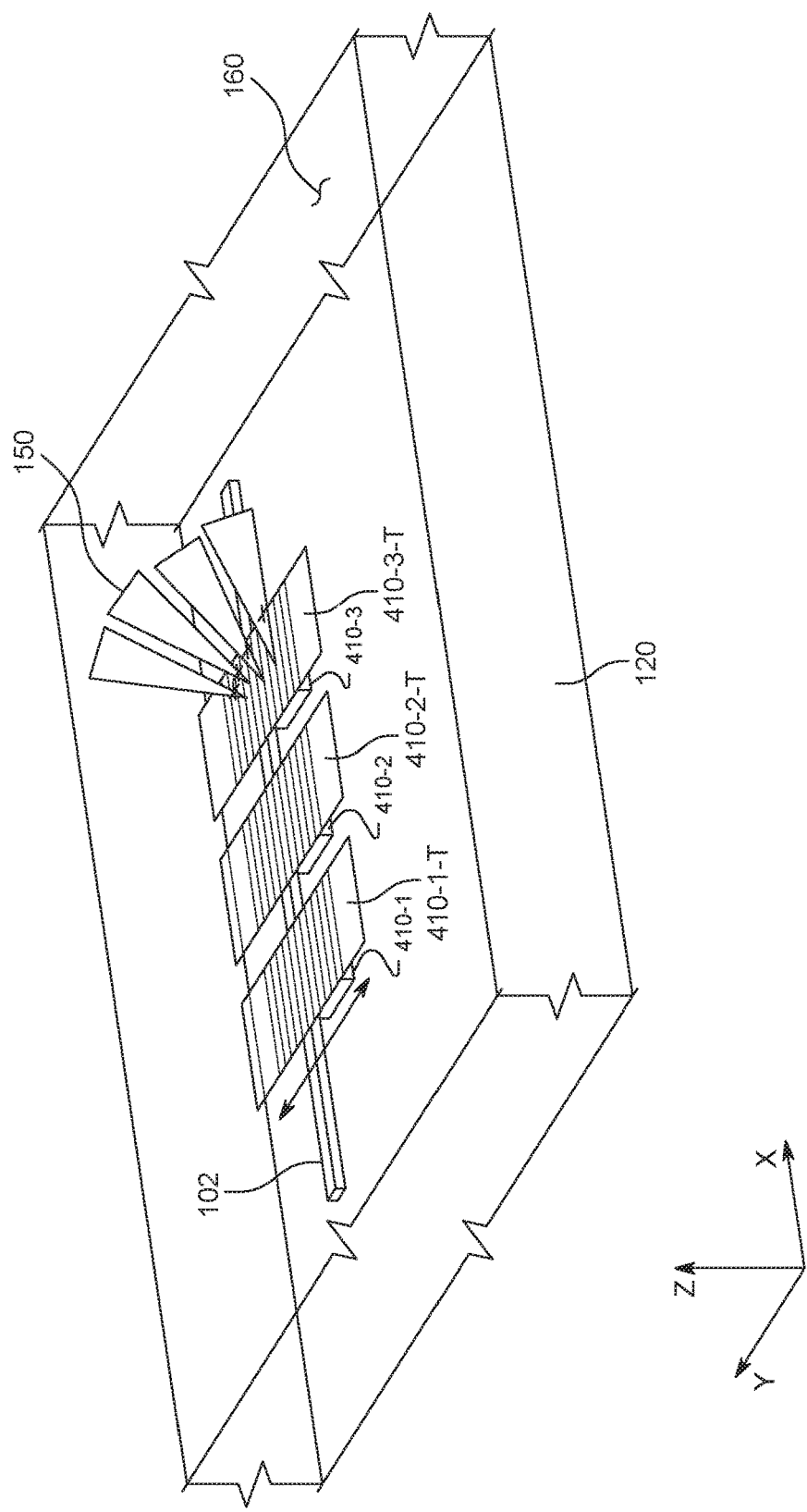
FIG. 12 is an elevated perspective view of a pixel set of output couplers for a waveguide showing a combination of different output couplers.

An additional layer of output couplers can be placed on the top or bottom surface of the substrate 120, as shown in FIG. 12, to deflect the output fans 150 in the x-z plane. This arrangement can either provide an alternative method of achieving vertical parallax, or enhance the field of view in other embodiments as described above. This additional layer of output couplers 410 has the rulings oriented perpendicular to the rulings in the output couplers described above.

In more detail, the waveguide 102 has a set of three output couplers 410-1, 410-2, 410-3. As described previously, these output couplers might be volume gratings formed in the bulk of the substrate 120. Further, there are surface grating secondary output couplers associated with each of the three volume grating output couplers 410-1, 410-2, 410-3. For example, on the proximal face 160, there is a first surface grating output coupler 410-1-T, a second surface grating output coupler 410-2-T and a third surface grating output coupler 410-3-T that are located in the beam path, such as above each of the three volume grating output couplers 410-1, 410-2, 410-3, respectively, to further shape and direct the beams as they are emitted from the substrate 120.

Stretchable gratings have been demonstrated in several different formats, including actuation by MEMs devices, see Truxal et al., *Design of a MEMS tunable polymer grating for single detector spectroscopy*, International Journal of Optomechatronics 2.2 (2008): 75-87; electrostrictive polymers actuated with surface electrical contacts, see Aschwanden et al., *Diffractive transmission grating tuned by dielectric elastomer actuator*, IEEE Photonics Technology Letters 19.14 (2007): 1090-1092; and electrostrictive polymers composed of conductive polymers, see Ji et al., *Soft tunable diffractive optics with multifunctional transparent electrodes enabling integrated actuation*, Applied Physics Letters 109.19 (2016): 191901; all incorporated herein by reference in their entireties. In these examples, diffractive gratings are stretched in order to change the periodicity of the grating, sweeping the diffraction angle. This could be used to produce a series of views for vertical parallax, or could be combined in one of the embodiments described above to increase the number of attainable views for vertical parallax (i.e. six views from output coupling gratings rotated about the x-axis and each of those is redirected by e.g., ±5 degrees by an actuated grating).

Electrically switchable gratings have also been demonstrated (e.g., Sutherland et al., *Electrically switchable volume gratings in polymer-dispersed liquid crystals*, Applied Physics Letters 64.9, 1074-1076, 1994). The grating transmits or reflects either the $0^{th}$ order or into a fixed set of diffraction angles. Each set of switchable gratings on the surface of the device could thus address two views for vertical parallax or be combined in an embodiment to expand the number of views for vertical parallax.

The use of volume gratings to produce a surface emitting device has been suggested by others, (e.g., Savidis et al., *Progress in fabrication of waveguide spatial light modulators via femtosecond laser micromachining*, Proc. of SPIE Vol. Vol. 10115. 2017; Jolly et al., *Near-to-eye electroholography via guided-wave acousto-optics for augmented reality*, Proc. of SPIE Vol. 10127. 2017, p. 101270J.).

Timing of the propagating SAW and input laser pulses is important to a video display of pixels on the order of 1 mm×1 mm and sub-pixels on the order of 100 µm in length along the z-axis. Light must be fed into the waveguides when the propagating SAW is aligned with the correct set of sub-pixel gratings. For example, given the speed of sound within $LiNbO_3$ of approximately 4000 m/s, the optical illumination must be accurate to within 25 ns and have a duration of <25 ns to synchronize the illumination with the SAW location accurately to within 100 µm along the length of the waveguide. These specifications of illumination timing accuracy and maximum duration are dependent on the desired optical quality of the output, size of the output coupling gratings, and spacing of the output coupling gratings. This is possible with modern electronically controlled laser diodes, but needs to be accounted for in the design of the SAW transducers (e.g., IDTs), optical illumination, and control circuits.

Figure 13:
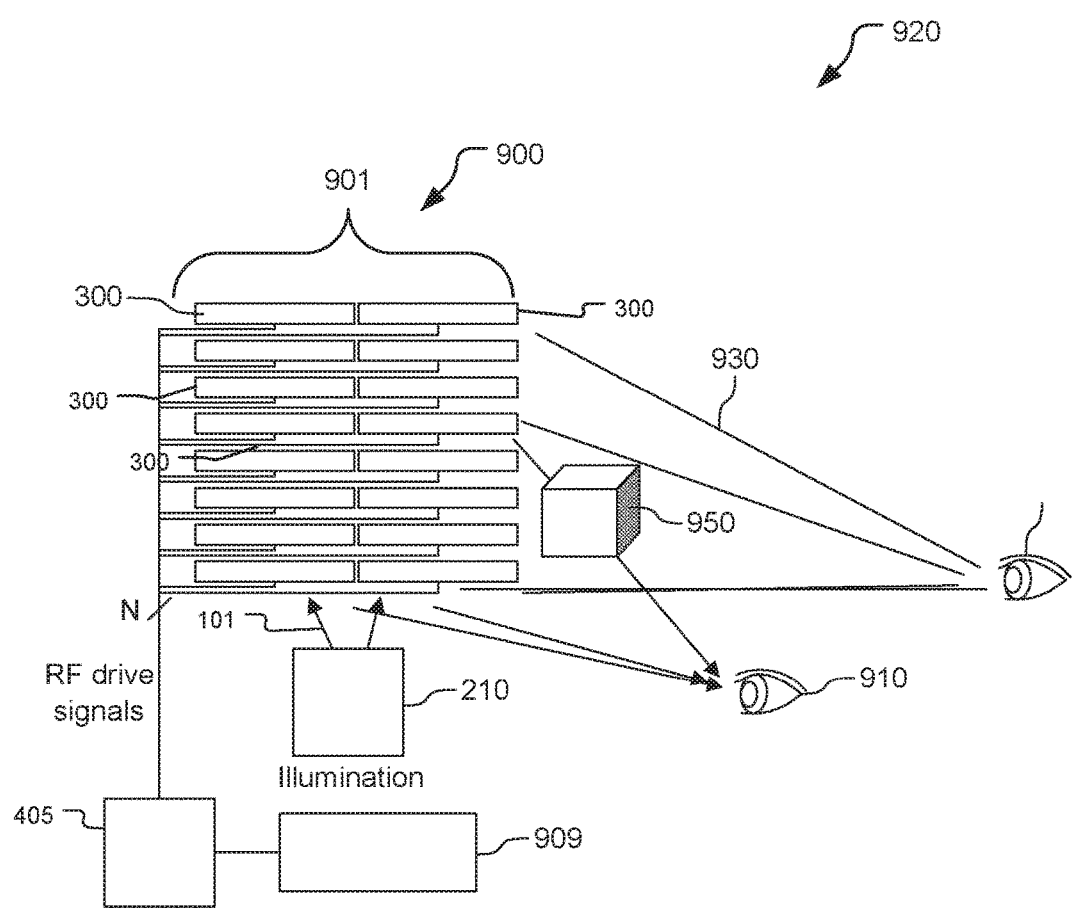
FIG. 13 shows a 3D display system that includes an electro-holographic 3D display and other components for powering and controlling the electro-holographic 3D display, where the display is formed from a dual-column stack of light field generator devices.

FIG. 13 shows a 3D display system 920. The 3D display system 920 includes an electro-holographic 3D display 900. The RF controller 405 and a processor 909 are also shown. Here, the electro-holographic light field generator devices 300 are arranged in a dual column stack 901.

Each of the electro-holographic light field generator devices 300 within the electro-holographic 3D display 900 receives a beam of input light 101 generated by illumination source 210. The illumination source 210 might be a laser such as a pulsed laser, to cite one of many possible examples of illumination light sources 210. The laser might illuminate the generator devices 300 together in a beam. Separate in-coupling prisms or gratings could be used to couple light into each of the separate waveguides formed in the devices.

The light field generator devices 300 are driven by the RF controller 405. The RF driver 405 is governed by processor 909 on the basis of typically digitized graphical data resident or derived in a format appropriate for the electro-optical subsystem of the light field display 900. The 3D display system 920 produces a modulated exit beam 930, in accordance with any of the teachings provided herein above, such that observers 910 in the far field perceive an object 950 to be projected in three dimensions.

It is also important to note that such light field generators 300, though described in the specific context of 3D display systems, also can usefully be applied to other applications such as optogenetics, 3D printing, cloaking, and near-eye displays for augmented reality/virtual reality (AR/VR).

Embodiments of the invention may be implemented in part in any conventional computer programming language such as VHDL, SystemC, Verilog, ASM, Python, C, C++, MATLAB etc. Alternative embodiments of the invention may be implemented as pre-programmed hardware elements such as, without limitation, combinations of one or more of a field-programmable gate array (FPGA), graphics processing unit (GPU), central processing unit (CPU) and other related components, or as a combination of hardware and software components.

While this invention has been particularly shown and described with references to preferred embodiments thereof, it will be understood by those skilled in the art that various changes in form and details may be made therein without departing from the scope of the invention encompassed by the appended claims.

What is claimed is:

1. A light field generator device, comprising:
   a device substrate;
   an array of waveguides formed in the substrate;
   one or more surface acoustic wave (SAW) transducers for generating a SAW in the substrate;
   a set of output couplers for each of the waveguides for directing diffracted light from the waveguide at different output angles with respect to each other.

2. The light field generator device as claimed in claim 1, further comprising multiple sets of output couplers for each of the waveguides.

3. The light field generator device as claimed in claim 1, wherein the set of output couplers comprises at least three output couplers at different angles with respect to the waveguide.

4. The light field generator device as claimed in claim 1, wherein each of the waveguides has a separate SAW transducer.

5. The light field generator device as claimed in claim 1, wherein the SAW transducers are shared among adjacent waveguides.

6. The light field generator device as claimed in claim 1, wherein the output couplers comprise volume gratings formed in the substrate.

7. The light field generator device as claimed in claim 1, wherein the substrate comprises a SAW substrate bonded to a transparent substrate and the output couplers are gratings formed in the transparent substrate.

8. The light field generator device as claimed in claim 1, wherein the output couplers comprise gratings bonded to a distal side of the substrate.

9. The light field generator device as claimed in claim 1, wherein the output couplers comprise gratings bonded to or formed on side walls of trenches formed in a distal side of the substrate.

10. The light field generator device as claimed in claim 1, wherein the output couplers are rotated with respect to the waveguide to provide horizontal and/or vertical parallax.

11. The light field generator device as claimed in claim 1, wherein the output couplers are reflective gratings.

12. The light field generator device as claimed in claim 1, wherein the output couplers are transmissive gratings.

13. The light field generator device as claimed in claim 1, wherein the output couplers function as different sub-pixels, to provide light to different viewing directions.

14. The light field generator device as claimed in claim 1, wherein the output couplers function to increase the angular fan of the exit light.

15. A 3D display system comprising one or more a light field generator devices, wherein each of the devices comprises:
a device substrate;
an array of waveguides formed in the substrate;
one or more surface acoustic wave (SAW) transducers for generating a SAW in the substrate; and
a set of output couplers for each of the waveguides for directing diffracted light from the respective waveguide at different output angles with respect to each other.

16. A method for generating a light field, comprising:
diffracting light out of waveguides with surface acoustic waves (SAWs) formed in a substrate;
directing the diffracted light with different output couplers arranged along the length of the waveguides and at different angles with respect to each other.

17. The method as claimed in claim 16, wherein multiple sets of output couplers are provided for each of the waveguides.

18. The method as claimed in claim 16, wherein the set of output couplers comprises at least three output couplers at different angles with respect to the waveguide.

19. The method as claimed in claim 16, further comprising generating the SAWs with separate SAW transducers.

20. The method as claimed in claim 16, further comprising generating the SAWs with shared transducers.

21. The method as claimed in claim 16, wherein the output couplers comprise volume gratings formed in the substrate.

22. The method as claimed in claim 16, wherein the substrate comprises a SAW substrate bonded to a transparent substrate and the output couplers are gratings formed in the transparent substrate.

23. The method as claimed in claim 16, wherein the output couplers comprise gratings bonded to a distal side of the substrate.

24. The method as claimed in claim 16, wherein the output couplers comprise gratings bonded to or formed on side walls of trenches formed in a distal side of the substrate.

25. The method as claimed in claim 16, further comprising rotating the output couplers with respect to the waveguide to provide horizontal and/or vertical parallax.

26. The method as claimed in claim 16, wherein the output couplers are reflective gratings.

27. The method as claimed in claim 16, wherein the output couplers are transmissive gratings.

28. The method as claimed in claim 16, further comprising the output couplers functioning as different sub-pixels, to provide light to different viewing directions.

29. The method as claimed in claim 16, further comprising the output couplers functioning to increase the angular fan of the exit light.

* * * * *